US006407462B1

(12) United States Patent
Banouvong et al.

(10) Patent No.: US 6,407,462 B1
(45) Date of Patent: Jun. 18, 2002

(54) IRREGULAR GRID BOND PAD LAYOUT ARRANGEMENT FOR A FLIP CHIP PACKAGE

(75) Inventors: Nikon Banouvong, San Jose; Farshad Ghahghahi, Los Gatos, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/753,000

(22) Filed: Dec. 30, 2000

(51) Int. Cl.⁷ .............................................. H01L 23/28
(52) U.S. Cl. ...................... 257/787; 257/778
(58) Field of Search ............................. 257/787, 778, 257/691; 361/735, 760; 437/182, 211; 438/111

(56) References Cited

U.S. PATENT DOCUMENTS

| | | | | |
|---|---|---|---|---|
| 5,376,588 A | * | 12/1994 | Pendse | 437/211 |
| 5,696,027 A | * | 12/1997 | Crane, Jr. et al. | 437/182 |
| 5,952,726 A | * | 9/1999 | Liang | 257/778 |
| 6,048,753 A | * | 4/2000 | Farnworth et al. | 438/111 |
| 6,064,113 A | * | 5/2000 | Kirkman | 257/691 |
| 6,111,756 A | * | 8/2000 | Moresco | 361/735 |
| 6,198,635 B1 | * | 3/2001 | Shenoy et al. | 361/760 |

\* cited by examiner

Primary Examiner—Hoai V. Ho
Assistant Examiner—Thinh Nguyen
(74) Attorney, Agent, or Firm—Westman, Champlin & Kelly

(57) ABSTRACT

According to the present invention, a first plurality of solder bumps are arranged the active surface of an integrated circuit die in the form of a grid comprising a plurality of rows and a plurality of columns, where the plurality of rows are parallel to two opposing edges of the active surface and the plurality of columns are perpendicular to the plurality of rows. The plurality of columns are separated by a distance D. Each of the solder bumps in every other row is separated from an adjacent solder bump in that row by a distance 2D such that the each of these solder bumps is disposed along a first group of the plurality of columns. Each of the solder bumps in the remaining rows, is separated from an adjacent solder bump in that row by the distance 2D such that the solder bumps in the remaining rows are disposed along a second group of the plurality of columns. Each column within the second group of columns is adjacent to, and in between, two of the columns within the first group of columns. In other words, the solder bump pads are staggered.

13 Claims, 3 Drawing Sheets

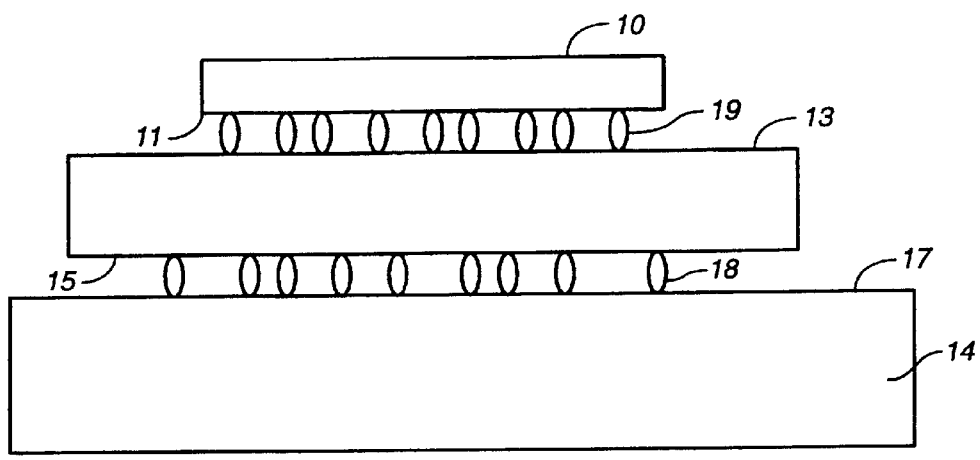
FIG._1
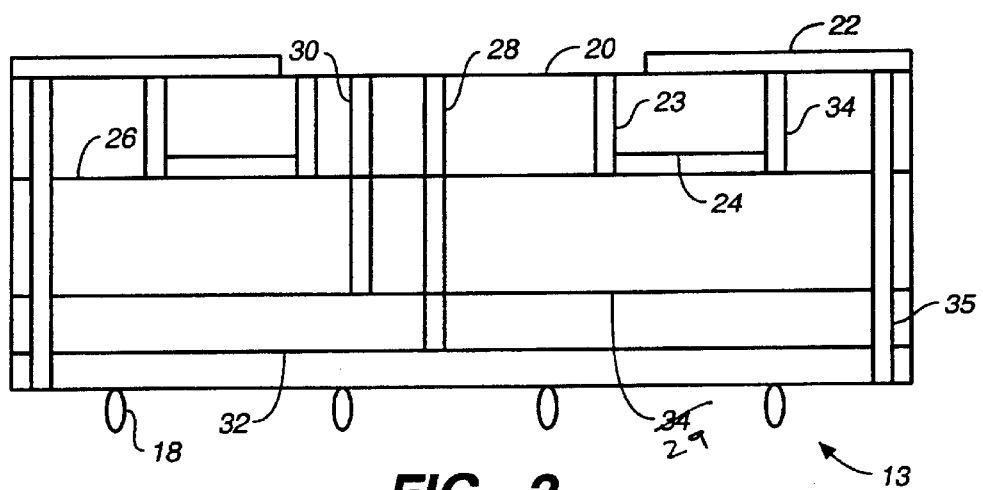
FIG._2

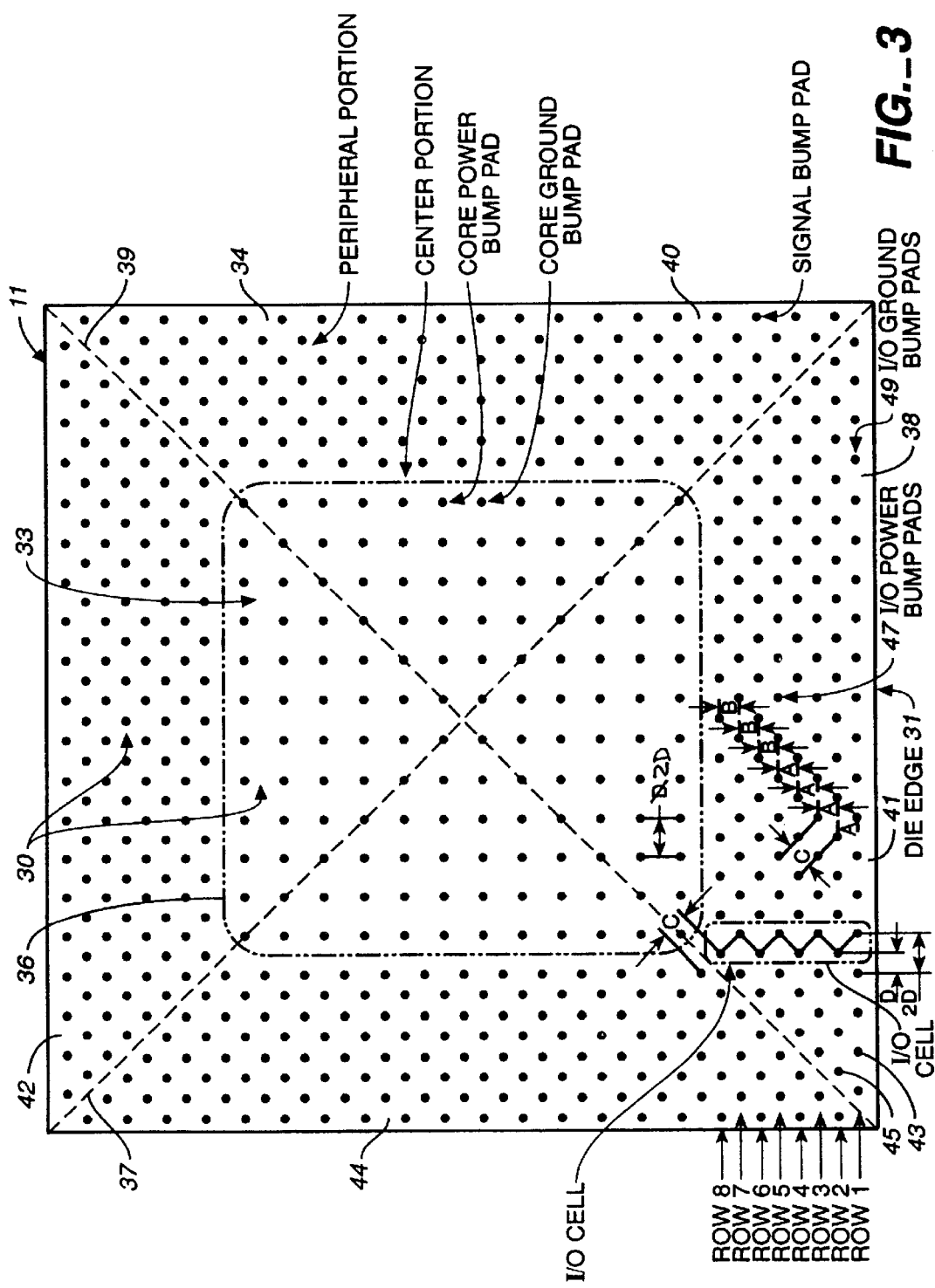
FIG._3

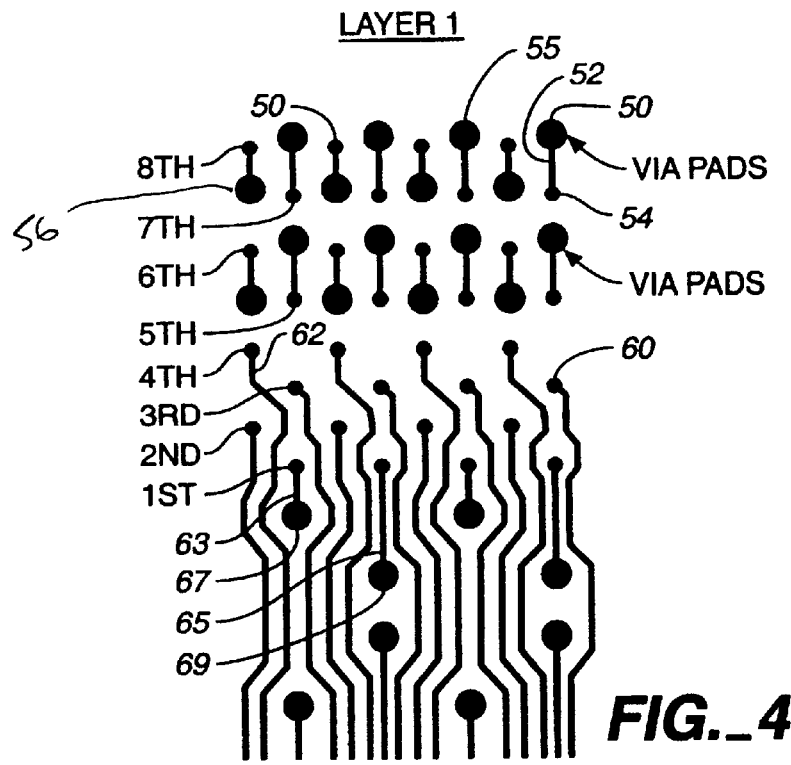
FIG._4a
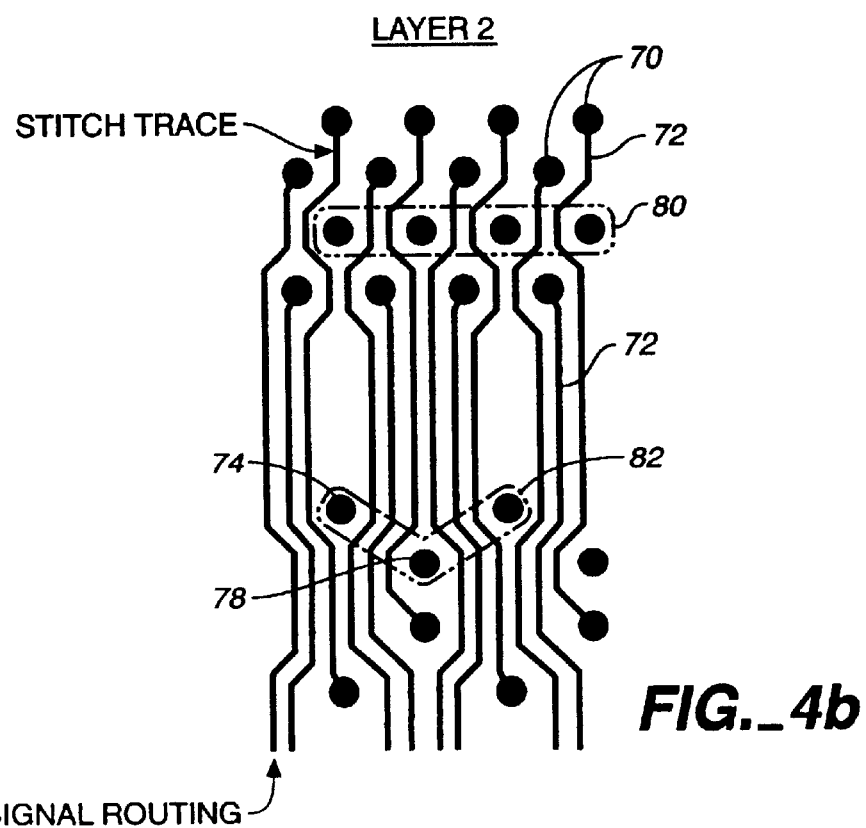
FIG._4b

IRREGULAR GRID BOND PAD LAYOUT ARRANGEMENT FOR A FLIP CHIP PACKAGE

BACKGROUND OF THE INVENTION

1. Field of the Invention

This invention relates to integrated circuit packaging, and more particularly to a an integrated circuit die solder bump arrangement useful in connection with flip-chip packages. The invention also relates to a routing scheme for a substrate upon which such a die may be mounted.

2. Description of the Related Art

Flip-chips are becoming an increasingly popular package for integrated circuits. FIG. 1 illustrates a conventional flip-chip type package. As shown, a semiconductor die 10 has a series of gates or other logic elements constructed on its downward-facing (active) surface 11, which has a plurality of solder bumps 19 disposed thereon in the form of a regularly spaced grid (i.e. all solder bumps line up across rows and columns). The die 10 is mounted to a substrate 13 which is then affixed to a printed circuit board (PCB) 14. Die 10 is bonded to the substrate 13 by the solder bumps 19 on the surface 11. In turn, the substrate 13 has a bottom surface 15 that comprises a plurality of solder balls 18 that electrically couple with bond pads on a top surface 17 of the PCB 14.

FIG. 2 shows a cross section of the substrate 13. As shown, a top surface 20 traces 22 for routing outer rows of the solder bumps 19. Each of the traces 22 connects to a corresponding one of a plurality of vias 35, which are in turn connected to solder balls (not shown). A plurality of vias 23 connects respective ones of the inner rows of the plurality of solder bumps 19 with traces 24 on a surface 26, along which they are routed. The traces 24 are routed along the surface 26 and connect to a plurality of vias 34, which connect the traces 24 to the traces 22 on the surface 20. The traces 22, in turn, connects to a plurality of vias 35 that extend through the substrate 13 and couple to corresponding one of the solder balls 18. Power and ground solder bumps are connected by respective pluralities of vias 28 and 30 to power and ground planes 32 and 29, respectively. (For purposes of clarity, FIG. 2 omits many well known details regarding connections between traces, vias, planes, etc.).

High performance ICs frequently require hundreds or even thousands of interconnections for input/output (I/O) or power and ground. Flip-chip interconnections must satisfy power ratio constraints, where the number of I/O interconnections drive the total number of power connections on the chip. The ratio between the number of I/O connections and power connections to support modern chip specifications are in the 4 to 1 range. I/O to power ratios of 5 to 1 or 6 to 1 are not unusual. If the ratio is 6 to 1, there can be no more than six times as many I/O connections as power source connections can exist between the die and the package. For every power source connection there is one ground source connection (i.e. the signal/power/ground ratio is 6:1:1).

The large number of connections in combination with the constraint regarding the ratio between signal, power and ground signals poses difficult problems for the design of a solder bump layout on the surface 11. It would be desirable to improve upon the routing density afforded by conventional solder bump pad arrangements according to which solder bump pads are laid out in a regular grid.

SUMMARY OF THE INVENTION

The present invention is an efficient layout for solder bump pads on an integrated die. The present invention also comprises a corresponding substrate for mounting such an integrated circuit die. According to the present invention, a first plurality of solder bumps are arranged the active surface of an integrated circuit die in the form of a grid comprising a plurality of rows and a plurality of columns, where the plurality of rows are parallel to two opposing edges of the active surface and the plurality of columns are perpendicular to the plurality of rows. The plurality of columns are separated by a distance D. Each of the solder bumps in every other row is separated from an adjacent solder bump in that row by a distance 2D such that the each of these solder bumps is disposed along a first group of the plurality of columns. Each of the solder bumps in the remaining rows, is separated from an adjacent solder bump in that row by the distance 2D such that the solder bumps in the remaining rows are disposed along a second group of the plurality of columns. Each column within the second group of columns is adjacent to, and in between, two of the columns within the first group of columns. In other words, the solder bump pads are staggered.

A substrate corresponding to the above described die is also disclosed. On the top surface of the substrate, via pads are interleaved with solder bump pads along rows which correspond to the inner rows (i.e. the rows closest to the center of the die) of the die grid. Each of the via pads is connected by a short trace to a corresponding solder bump pad in an adjacent row in the same column. Outer rows of solder bump pads are routed by traces along the top surface of the substrate. The inner rows are routed through vias that connect to the via pads; solder bump pads corresponding to signal I/O are routed along another substrate layer while solder bump pads corresponding to reference I/O (e.g. I/O power or ground) are routed through vias that connect to the via pads to reference planes.

Staggering the solder bumps enables traces on the substrate to be routed between solder bump pads that are in adjacent rows and adjacent columns or between via pads that are in adjacent rows and adjacent columns. In this manner, the present invention provides for a highly space efficient routing arrangement.

BRIEF DESCRIPTION OF THE DRAWINGS

Other objects and advantages of the invention will become apparent upon reading the following detailed description and upon reference to the accompanying drawings in which:

FIG. 1 illustrates a conventional flip-chip type package.

FIG. 2 shows a cross section of a substrate that is part of the package shown in FIG. 1.

FIG. 3 shows a solder bump pad arrangement for an active die face according to an embodiment of the present invention.

FIG. 4a shows a routing scheme for the top layer of the substrate shown in FIG. 2, according to an embodiment of the present invention.

FIG. 4b shows a routing scheme for the second to the top most layer of the substrate shown in FIG. 2, according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 3 illustrates a possible solder bump arrangement for the active surface 11 according to the present invention. The surface 11 comprises four edges, including an edge 31, in the shape of a first rectangular section 34; the first rectangular section 34 defines two diagonal lines 37 and 39. A plurality of solder bumps 30 are disposed in two distinct regions: (a) a plurality of core solder bumps 33 (or solder bump pads) are disposed within a second rectangular section 36, centered on the active surface 11, with four edges; and (b) a plurality of peripheral solder bumps are disposed outside of the second rectangular section 36. (While solder bumps are shown on the active surface of an integrated circuit die, it will be appreciated that the solder bumps may be placed on a substrate and the die then placed on the substrate.) The plurality of core solder bumps correspond to core power and core ground voltage levels. The plurality of peripheral solder bumps, which correspond to I/O power, I/O ground and signal I/O, is divided into four trapezoidal regions 38, 40, 42, and 44, each of which is defined by an edge of the first rectangular section 34, one of the edges of the second rectangular section 36 parallel to the above mentioned edge of the first rectangular section 34, and the two diagonal lines 37 and 39.

A first plurality of solder bumps 41 in region 38 are arranged in the form of a grid comprising a plurality of rows and a plurality of columns, where the plurality of rows are parallel to two opposing edges of the active surface and the plurality of columns are perpendicular to the plurality of rows. The plurality of columns are separated by a distance D. Each of the solder bumps in every other row (such as a first group 43 of solder balls in row 1) is separated from an adjacent solder bump in that row by a distance 2D such that the each of these solder bumps is disposed along a first group of the plurality of columns. Each of the solder bumps in the remaining rows (such as a second group of solder bump pads 45 in row 2), is separated from an adjacent solder bump in that row by the distance 2D such that the solder bumps in the remaining rows are disposed along a second group of the plurality of columns. Each column within the second group of columns is adjacent to, and in between, two of the columns within the first group of columns.

A distance A separates adjacent rows within a first plurality of rows and a distance B, which is greater than A, separates adjacent rows, further away from the die edge 31 than the first plurality of rows, within a second plurality of rows. A separating row (row 5 in FIG. 3) separates the first plurality of rows from the second plurality of rows; the single row is a distance A from an adjacent row within the first plurality of rows and is a distance B from an adjacent row within the second plurality of rows.

[Exemplary Choices for A, B and D are: ].

A first group of reference solder bumps 47 (i.e. corresponding to power or ground), in this case corresponding to power, is disposed along the separating row (row 5). A second group of reference solder bumps 49 (in this case ground) is disposed along the closest row (row 1) to the die edge 31.

Solder bumps in regions 40, 42 and 44 are preferably arranged in the same manner as the solder bumps in region 38. Core solder bump pads 33 are arranged in the form of a grid with rows and columns each separated from one another by the distance 2D.

FIG. 4a shows a possible routing scheme for the surface 20 (see FIG. 2) that is compatible with the layout shown in FIG. 3. The rows and columns shown in FIG. 4a align with the rows and columns shown in FIG. 3. As shown in FIG. 4a, a first plurality of via pads 50 and a first plurality of substrate solder bump pads 54 are disposed on the top surface 20; the first plurality of solder bump pads 54 are disposed along the first few inner rows (i.e. the rows in FIG. 3 that are farthest away from the die edge 31), which are rows 7 and 8 in FIG. 4a. Each of a first plurality of short traces 52 connects one of the plurality of via pads 50 to a corresponding one of the plurality of solder bump pads 54. Each of a first group of the first plurality of via pads 50 (such as via pad 55) is disposed in a particular column that is between (and is adjacent to) a pair of the first plurality of columns, and is coupled by a corresponding one of the first plurality of short traces 52 to a corresponding one of the first plurality of solder bump pads 54 in that particular column. Similarly, each of a second group of the first plurality of via pads 50 (such as via pad 56) is disposed in a particular column that is between a corresponding pair of the second plurality of columns, and is coupled by a corresponding one of the first plurality of short traces 52 to a corresponding one of the first plurality of solder bump pads 54 in that particular column. In other words, solder bump pads and via pads are interleaved along the rows.

More particularly, along row 1, in every other column, solder bump pads are connected by traces of a first length to via pads in the same column (e.g. see trace 63). In the remaining columns, solder bump pads are connected by traces of a second length, longer than the first length, to via pads in the same column (e.g. see trace 65). As shown, this arrangement enables as many as three traces to be routed in between adjacent via pads (e.g. via pads 67 and 69).

A second plurality of solder bump pads 60 are disposed along the outer rows, shown as rows 1–4 in FIG. 4a. Certain of the traces 22 (see FIG. 2) such as trace 62 (see FIG. 4a) route corresponding ones of the second plurality of solder bump pads to corresponding ones of the vias 35. According to the present invention, certain of the traces 22 are routed at least in part directly between two solder bump pads that are in adjacent rows and adjacent columns (e.g. a solder bump pad in row 2, column 1 and a solder bump pad in row 1, column 2). Those of the second plurality of solder bump pads 60 on row 1 are routed by straight, short traces to via pads.

FIG. 4b shows a routing scheme for the surface 26 (see FIG. 2). A second plurality of via pads 70 is disposed on the surface 26, directly underneath a corresponding one of the first plurality of via pads 50. Also shown in FIG. 4B are cross sections 80 and 82 of vias 28 and 30, respectively (See FIG. 2); these vias 28 and 30 connect to corresponding via pads (i.e. the via pads connected to bump pads on rows 1 and 5) on the surface 20. A third plurality of signal traces 72 is disposed on the surface 26. Some of these traces are routed at least in part between two of the vias that are in adjacent rows and adjacent columns. Similar to the arrangement described with reference to FIG. 4a, a plurality of traces are routed between adjacent via pads and/or vias; in this case, in FIG. 4b there are three such traces such as the traces routed in between two of the plurality of vias 30 (Shown in cross section as number 82), (Such as via 74 and an adjacent via pads 78).

Conclusion

Numerous variations and modifications will become apparent to those skilled in the art once the above disclosure is fully appreciated. It is intended that the following claims be interpreted to embrace all such variations and modifications.

What is claimed is:

1. A semiconductor die having an active region in a first substantially square section having four edges, the first substantially square section defining two diagonal lines, the die comprising:
a first plurality of solder bump pads on the active surface arranged in the form of a grid comprising a plurality of rows and a plurality of columns, wherein the plurality of rows are parallel to two opposing edges of the active surface and the plurality of columns are perpendicular to the plurality of rows, wherein the plurality of columns are separated by a distance D, and wherein each of a first group of solder bump pads in a first row is separated from an adjacent solder bump pad in the first row by a distance 2D such that the first group of solder bump pads is disposed along a first plurality of columns, and wherein each of a second group of solder bump pads in a second row, which is adjacent to the first row, is separated from an adjacent solder bump pad by the distance 2D such that the second group of solder bump pads is disposed along a second plurality of columns, wherein each of the second plurality of columns is adjacent to, and in between, two of the first plurality of columns; and
a plurality of core solder bumps corresponding to core power and core ground disposed within a second substantially square section centered within the first substantially square section and defined by four edges aligned substantially parallel to the four edges of the first substantially square section, the core solder bumps arranged in a grid with rows and columns separated from each other by a distance 2D.

2. The semiconductor die according to claim 1 wherein a first portion of the first plurality of solder bump pads corresponds to I/O power, a second portion of the first plurality of solder bump pads corresponds to I/O ground, and a third portion of the first plurality of solder bump pads corresponds to I/O signals.

3. The semiconductor die according to claim 1 wherein the distance between adjacent rows varies.

4. The semiconductor die according to claim 3 wherein a distance A separates adjacent rows within a first plurality of rows and a distance B separates adjacent rows within a second plurality of rows, and a single row separates the first plurality of rows from the second plurality of rows, wherein the single row is a distance A from an adjacent row within the first plurality of rows and is a distance B from an adjacent row within the second plurality of rows.

5. The semiconductor die according to claim 1 wherein the first group of solder bump pads is disposed along a first plurality of rows and wherein the second group of solder bump pads is disposed along a second plurality of rows.

6. The semiconductor die according to claim 4 wherein the first plurality of rows are between the single row and an edge of the first substantially square section, and the second plurality of rows are between the single row and an edge of the second substantially square section and wherein the distance B is greater than the distance A.

7. The semiconductor die according to claim 1 wherein the first plurality of solder bump pads are arranged in four trapezoidal regions between corresponding edges of the first and second substantially square sections.

8. The semiconductor die according to claim 1 further comprising a plurality of solder bumps disposed on the first and second groups of solder bump pads.

9. A substrate for connecting a semiconductor die to a printed circuit board, the substrate comprising:
first and second layers;
a top surface on top of the first layer with four outer edges;
a routing surface between the first and second layers;
a first plurality of via pads disposed on the top surface;
a first plurality of solder bump pads disposed on the top surface;
a first plurality of traces connecting respective ones of the first plurality of via pads with corresponding ones of the first plurality of solder bump pads; wherein
the first plurality of via pads and the first plurality of solder bump pads are arranged in the form of a grid defined by rows that are parallel to a first one of the outer edges of the top surface and columns that are perpendicular to the rows;
the first plurality of solder bump pads arranged along a first plurality of the rows;
a first group of the first plurality of via pads is interleaved with a first group of the first plurality of solder bump pads along at least a portion of a first one of the rows.

10. The substrate according to claim 9 wherein a second group of the first plurality of via pads is interleaved with a second group of the first plurality of solder bump pads along at least a portion of a second one of the rows that is adjacent to the first one of the rows.

11. The substrate according to claim 10 further comprising:
a second plurality of solder pads disposed on the top surface, the second plurality of solder bump pads arranged on the grid, the second plurality of solder bump pads arranged along a second plurality of rows beginning with the row closest to the first one of the outer edges of the top surface;
a second plurality of traces routing the second plurality of solder bump pads; wherein
a first one of the first plurality of signal traces is routed at least in part directly between two of the second plurality of solder bump pads that are in adjacent rows and adjacent columns.

12. The substrate according to claim 11 further comprising:
a second plurality of via pads on the routing surface, each of the second plurality of via pads directly underneath a corresponding one of the first plurality of via pads,
a first plurality of vias connecting respective ones of the first plurality of via pads with corresponding ones of the second plurality of via pads, a second plurality of vias connected to respective ones of the first plurality of via pads and extending through the routing surface,
a third plurality of traces disposed on the routing surface, wherein at least two of the third plurality of traces are routed between adjacent ones of the second plurality of vias.

13. The substrate according to claim 12 wherein three of the third plurality of traces are routed between adjacent ones of the second plurality of vias.

* * * * *